United States Patent [19]

Akimoto et al.

[11] 4,151,432
[45] Apr. 24, 1979

[54] PRODUCTION OF FERRITES FOR MAGNETOSTRICTIVE VIBRATORS

[75] Inventors: Yumi Akimoto; Tamotsu Ishii, both of Omiya; Motohiko Yoshizumi, Urawa; Sadaaki Haghino, Omiya, all of Japan

[73] Assignee: Mitsubishi Kinzoku Kabushiki Kaisha, Japan

[21] Appl. No.: 663,732

[22] Filed: Mar. 4, 1976

Related U.S. Application Data

[63] Continuation-in-part of Ser. No. 484,869, Jul. 1, 1974, abandoned.

[30] Foreign Application Priority Data

| Jul. 3, 1973 | [JP] | Japan | 48-74415 |
| Jul. 7, 1973 | [JP] | Japan | 48-76131 |
| Feb. 4, 1974 | [JP] | Japan | 49-13760 |
| Jul. 2, 1974 | [DE] | Fed. Rep. of Germany | 2431699 |
| Jul. 3, 1974 | [FR] | France | 74 23132 |
| Jul. 3, 1974 | [GB] | United Kingdom | 29452/74 |

[51] Int. Cl.$^2$ .......................................... H01F 7/02
[52] U.S. Cl. ............................... 310/26; 264/DIG. 58; 335/215; 335/296; 335/302; 366/127
[58] Field of Search ............... 310/26; 264/DIG. 58; 366/127; 335/296, 215, 302

[56] References Cited

U.S. PATENT DOCUMENTS

| Re. 28,381 | 4/1975 | Edson | 310/26 |
| 3,027,327 | 3/1962 | Blank | 264/65 |
| 3,375,195 | 3/1968 | Brockmon et al. | 310/26 |
| 3,717,039 | 2/1973 | Zinker | 310/26 |
| 3,753,058 | 8/1973 | Edson | 310/26 |

Primary Examiner—Robert F. White
Assistant Examiner—John A. Parrish
Attorney, Agent, or Firm—Robert E. Burns; Emmanuel J. Lobato; Bruce L. Adams

[57] ABSTRACT

A ferrite for magnetostrictrive vibrators is produced by the simple process of press forming a preformed structure formed from starting powder of magnetite or a mixture of magnetite and ferric oxide, said powder having an average particle size d ($\mu$) of from 0.02 to 5.0 $\mu$, sintering this structure in an atmosphere wherein the partial pressure of oxygen is from $10^{-1}$ to $10^{-11}$ atmosphere at a temperature of from 1,000° to 1,350° C. and which will meet the requirement:

$$140 \log d + 1,305 \geq T(°C.) \geq 160 \log d + 1,180$$

and thereafter cooling the structure thus sintered to room temperature at a cooling rate m (°C./min.) <0.5f where f(KHz) is a corresponding resonance frequency thereby to produce a macroscopically homogeneous ferrite structure containing as its principal constituent a sintered magnetite having an oxygen/iron (O/Fe) atomic ratio of 4.0/3<O/Fe<4.1/3, and a density of at least 90% of the theoretical density.

6 Claims, 23 Drawing Figures

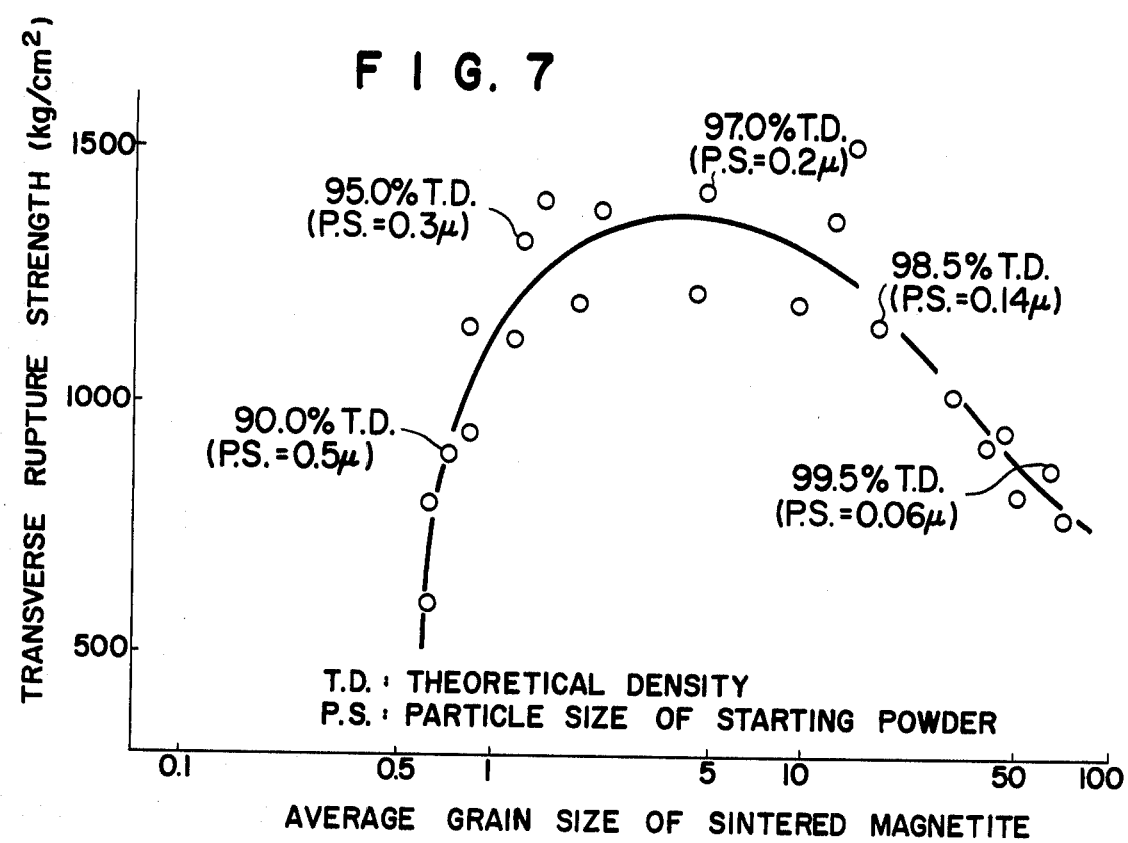
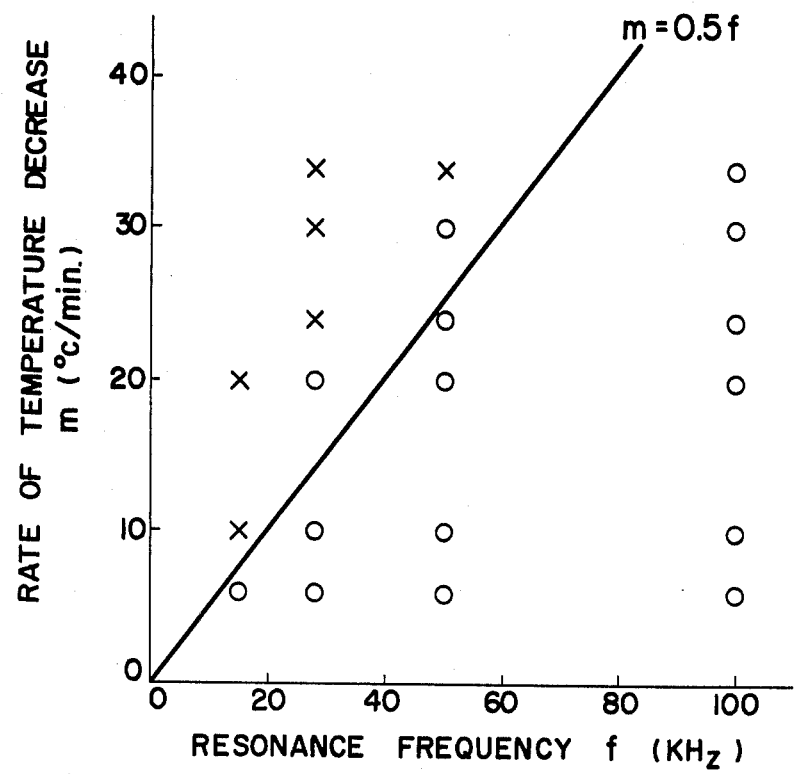

PRODUCTION OF FERRITES FOR MAGNETOSTRICTIVE VIBRATORS

CROSS REFERENCE TO RELATED APPLICATIONS

This application is a continuation-in-part of application Ser. No. 484,869 filed July 1, 1974 now abandoned.

BACKGROUND OF THE INVENTION

This invention relates generally to magnetostrictive vibrators and ferrites therefor and more particularly to the production of ferrites comprising sintered magnetite for magnetostrictive vibrators.

Some of the properties of sintered ferrite structures required for use as magnetostrictive vibrators are, according to our knowledge, as follows:

(a) High magnetostrictive properties, i.e., high electromechanical coupling coefficient k;
(b) High mechanical strength, i.e., high transverse rupture strength and high vibrational fatigue strength; and
(c) High electrical resistance.

In general, ferrites for magnetostrictive vibrators have the advantageous feature of higher resistivity or specific resistance even at frequencies in the ultrasonic region and, therefore, less eddy current loss whereby the electroacoustic efficiency of such magnetostrictive vibrators is improved, in comparison with metal magnetostrictive vibrators. For this reason, these ferrites have been widely used as vibrators of ultrasonic equipment, the principal examples of which are ultrasonic washing machines and ultrasonic fabricating machines and tools.

The ferrites used at present for magnetostrictive vibrators are all materials having Ni-Cu-Co ferrite as their principal constituent, but these materials are of complicated composition and are accompanied by the problem of high production cost due to high cost of the starting materials.

On one hand, magnetites have been known as exhibiting magnetostrictive property.

For example, saturated static magnetostriction of a magnetite is of the order of $+40 \times 10^{-6}$ while that of a ferrite is of the order of $-27 \times 10^{-6}$.

Of the spinel-type magnetostrictive materials, only the static magnetostriction of a magnetite is positive while that of Ni ferrite or Ni-Cu-Co ferrite is negative. A magnetostrictive vibrator having positive magnetostriction is considered to be more advantageously used under high input power as compared with the one having negative magnetostriction, the absolute value of both magnetostrictions being equal. In the case of ordinary uses, however, it matters little whether static magnetostriction is positive or negative but it is important for a magnetostrictive vibrator to have a large absolute value.

High static magnetostriction alone does not satisfy the static magnetostrictive property required for a magnetostrictive vibrator but it is also preferable that such a vibrator should have high static magnetostriction when effective biassing magnetic field is at a level as low as from 5 to 50 Oe which is usually employed.

Magnetites have the advantageous features of not only positive saturated static magnetostriction as well as positive static magnetostriction in a low effective biassing magnetic field but also a larger absolute value in comparison with Ni-Cu-Co ferrite.

In spite of these excellent static magnetostrictive properties, magnetites have not heretofore been used as magnetostrictive materials because a sintered magnetite structure having all the aforementioned properties (a), (b) and (c) required for a magnetostrictive material could not be obtained therefrom.

In connection with the above properties (a), (b) and (c), a sintered structure should have high density, and suitable grain size and composition while macroscopic inhomogeneity should not be caused in the sintered structure such as pores and cracks.

Hereinbelow, these requirements for a sintered structure will be set forth in more detail.

(1) High Density

The higher the density is, the larger will be the electromechanical coupling coefficient k (hereinafter referred to simply as k-value sometimes) mentioned in (a) above of the sintered structure obtained. (See V. E. Bottom, NBC (U.S.) Technical Note No.49, PB151408(1959), with reference to the fact that the k-value can be an index of the dynamic performance of a material for a magnetostrictive vibrator.)

Further, high density serves to improve the mechanical strength mentioned in (b).

Thus, it appears essential that the density of a sintered structure should be at least 90% of the theoretical density (5.2 g/cm$^3$, hereinafter referred to simply as T.D. sometimes) with respect to a single magnetite crystal.

(2) Suitable Grain Size

Too large a grain size of a sintered structure results in the lower mechanical strength in (b) while too small a grain size results in the lower k-value in (a). Accordingly, a sintered structure must have a suitable grain size.

(3) Composition

This requirement affects the electrical resistance in (c).

In general, ferrite vibrators have the advantageous feature of higher electrical resistance. However, the specific resistance of a magnetite is of the order of from $10^{-2}$ to $10^{-3}$ ohm cm., which is substantially low for a ferrite, and the eddy current loss is not negligible.

Then, a means for increasing the specific resistance is required, and we have found that this object can be achieved by controlling the composition of a sintered structure.

More specifically, the specific resistance has been found to be increased when a sintered structure has the monophase of $Fe_3O_{4+x}$ or the mixed phase of $Fe_3O_{4+x}$ and $Fe_2O_3$ and the composition thereof is in the range of $4.0/3 < O/Fe < 4.1/3$.

The specific resistance is also high in the range of $O/Fe \geq 4.1/3$, but the strength of (b) in turn decreases.

(4) Macroscopic Homogeneity of Structure

This requirement is related with the size of a magnetostrictive vibrator.

For a magnetostrictive vibrator is required a sintered structure of a given size with no cracks and substantially no pores throughout the structure thereof.

Only the sintered structure meeting all the above requirements (1) through (4) can be a magnetostrictive vibrator having the aforesaid properties (a), (b) and (c).

Such a sintered magnetite structure has not heretofore been produced successfully because it was deemed difficult to obtain from a magnetite, in contrast to Ni-Cu-Co ferrite, a sintered structure meeting the requirements (2) through (4) and at the same time having high mechanical strength of (b). This also means that a sintered magnetite structure having dynamic magnetostrictive properties, i.e., high mechanical coupling coefficient, could not be obtained therefrom.

Various methods are known in the art for the high-temperature treatment of magnetites, but most of them are directed at best to the control of compositions of magnetites. For example, see Darken, L. S. and Gurry, R. W., J. Am. Chem. Soc. 67, 1398-1412 (1945); ibit. 68, 798-816 (1946) for magnetite powder, and Blank, J. M., U.S. Pat. No. 3,027,327 for $\pi$-shaped magnetite structures.

No integral process has been found heretofor for producing sintered magnetite structures wherein the density and grain size thereof are controlled, still less any process for producing magnetostrictive vibrators by integrally controlling the magnetostrictive property, mechanical strength and electrical resistance of such sintered structures.

Thus, magnetostrictive vibrators formed of magnetites have not so far been obtained.

SUMMARY OF THE INVENTION

As a result of our research based on an insight into inherently superior magnetostrictive property of magnetites, we have found that sintered magnetite structures suitable for use as magnetostrictive materials can be obtained by controlling the sintering temperature and atmosphere, the period during which magnetites are maintained at the sintering temperature and further the rates of temperature rise and decrease for sintering and the particle size of starting powder, whereupon we have arrived at the present invention.

Accordingly, it is an object of this invention to provide a method for producing ferrites for magnetostrictive vibrators which ferrites, in comparison with conventional Ni-Cu-Co ferrites for magnetostrictive vibrators, not only have superior magnetostrictive characteristics but also entail a much lower starting material cost and have desirable properties such as high mechanical strength and high specific resistance.

In accordance with this invention, the foregoing object and other objects thereof are achieved by a method for producing ferrites for magnetostrictive vibrators which comprises sintering a preformed structure formed from starting powder selected from the group consisting of magnetite and a mixture of magnetite and ferric oxide and having an average particle size d($\mu$) in the range of $0.02 \leq d \leq 5.0$, said preformed structure having a size corresponding to a resonance frequency f(KHz) of from 15 to 100 KHz as a magnetostrictive vibrator, in an atmosphere wherein the partial pressure of oxygen is from $10^{-1}$ to $10^{-11}$ atmosphere at a temperature T(°C.) which will meet the following requirements:

$$1,000 \leq T \leq 1,350 \text{ and}$$

$$160 \log_{10} d + 1,180 \leq T \leq 140 \log_{10} d + 1,305$$

and thereafter cooling the structure thus sintered at a cooling rate m(° C./min.) which will meet the requirement:

$$m < 0.5 f$$

thereby to produce a macroscopically homogeneous sintered ferrite structure having an oxygen/iron (O/Fe) atomic ratio of $4.0/3 < O/Fe < 4.1/3$, a resonance frequency f of from 15 to 100 KHz, a density of at least 90% of the theoretical density and an average grain size of from 0.7 to 50$\mu$.

The nature, utility, and further features of the invention will be apparent from the following detailed description beginning with a consideration of general aspects of the invention and concluding with specific examples of practice illustrating preferred embodiments of the invention, when read in conjunction with the accompanying drawings.

BRIEF DESCRIPTION OF THE DRAWINGS

In the drawings:

FIG. 7 is a graph showing a curve indicating a relationship between grain size and transverse rupture strength of sintered magnetite obtained by sintering starting powder of various particle sizes at 1,150° C.;

FIG. 8 is a graph indicating whether samples having a different resonance frequency are crack-free ($\bullet$) or cracked (x) with variation of the rate of temperature decrease during production of the samples;

DETAILED DESCRIPTION

In the first place, the size of magnetostrictive vibrators covered by the present invention will be described since the resonance frequency of magnetostrictive vibrators is in direct relation with the size thereof and the difficulty of the production of sintered structures depends on the size of the sintered structures to be used as magnetostrictive vibrators.

The size of magnetostrictive vibrators is roughly determined by the resonance frequency f thereof. Magnetostrictive vibrators ordinarily resonate at a half of the acoustic wavelength. Accordingly, in the case of uniform vibrators of bar (round or square) shape, the maximum length 1 in the direction of the magnetic field applied to the vibrators is represented by $l=v/2f$ wherein v is the velocity of sound transmitted through the magnetostrictive material.

In the case of Ni-Cu-Co ferrite where v=5.7 km/sec, the length corresponding to the frequency mentioned above will be from 19.0 to 2.9 cm.

In the case of magnetite where v=5.4 km/sec., the length will be from 18.0 to 2.7 cm.

Such typical length (the maximum length in the direction of the magnetic field) of vibrators varies to some extent depending on the form thereof.

Figure 10:
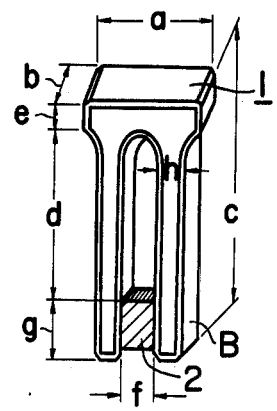
FIG. 10 shows a form and size of $\pi$-shaped magnetostrictive vibrator.

FIG. 10 is a perspective view showing a preferred π-shaped magnetite vibrator produced in accordance with this invention, wherein the reference numeral 1 designates the body of the vibrator and 2 represents a biassing magnet.

The sizes of the respective parts of this π-shaped magnetite vibrator required to give the various resonance frequencies 15 KHz, 28 KHz, 50 KHz and 100 KHz were as shown in the following Table 1 wherein the letters correspond to the correspondingly lettered parts in FIG. 10:

Table 1

| Size (mm) | Resonance Frequency (KHz) Size (mm) | | | |
|---|---|---|---|---|
| | 15 | 28 | 50 | 100 |
| a | 70 | 40 | 40 | 20 |
| b | 35 | 20 | 20 | 10 |
| c | 165 | 85 | 48 | 24 |
| d | 92 | 54 | 21 | 10 |
| e | 34 | 14 | 10 | 5 |
| f | 18 | 11 | 11 | 5 |
| g | 39 | 17 | 17 | 9 |
| h | 18 | 9 | 9 | 5 |

As apparent from the above data, the typical lengths of the π-shaped magnetostrictive vibrator corresponding to the respective resonance frequencies range from 16.5 to 2.4 cm.

Thus, the relationship between the size of a magnetostrictive vibrator and the resonance frequency slightly differs according to the form of the vibrator, but the size is in inverse proportion to the resonance frequency in any case. Accordingly, the resonance frequency is regarded as representing the size of a magnetostrictive vibrator, i.e., a sintered structure.

The resonance frequency in the range of from 15 to 100 KHz is herein selected for the following reasons:

Resonance frequencies of 15 KHz or lower will require larger sintered ferrites and cause difficulty in producing homogeneous crack-free ferrites by sintering.

Further, since such frequencies fall within the audible frequency range, there arise some problems in practical use.

On the other hand, resonance frequencies of 100 KHz or higher will result in smaller sintered structures so that driving force will be insufficient.

More particularly, the size of sintered structures may also be considerably concerned with production conditions. For example, large green shaped structures may require the use of a binder and, in such a case, a sintering process may have to be modified so as to avoid adverse influence of gasification of the binder during sintering. Furthermore, when large shaped structures are produced, careful attention must be paid because it requires a very long time for the structures to reach the equilibrium of composition.

Thus, not only the effect of heat treatment is different between shaped structures and powder but also the sintering process varies according to the size of shaped structures to be produced.

The foregoing circumstances apply to the process of the present invention, which is most suitable for the production of magnetite magnetostrictive vibrators having a resonance frequency of from 15 to 100 KHz.

First, the composition of sintered structures will be described with the view of increasing the electrical resistance.

(1) In general, a magnetite at a high temperature is in the form of a nonstoichiometric compound $Fe_3O_{4+x}$ (where $0<x<0.1$) and has a compositional width which is vastly wider than that at a low temperature. However, when a magnetite in this form of $Fe_3O_{4+x}$ which has been sintered at a sintering temperature of from 1,000 to 1,350° C. is caused to cool to a low temperature, in general, it assumes either a structure wherein fine particles of $Fe_2O_3$ are dispersed in a $F_3O_4$ matrix or a single phase structure of a form wherein $Fe_3O_{4+x}$ has been rapidly cooled.

(2) Moreover, a magnetite wherein the value of the x in the above mentioned $Fe_3O_{4+x}$ is in the range $0<x<0.1$ has very high specific resistance and mechanical strength.

(3) The value of x in the $Fe_3O_{4+x}$ at the time of magnetite sintering at a high temperature can be varied at will remain the range of $0<x<0.1$ by controlling the partial pressure of oxygen within the environmental atmosphere, and this value of x within this range can be attained by controlling the partial pressure of oxygen within a pressure range of from $10^{-1}$ to $10^{-11}$ atmosphere. Then, by controlling the partial pressure of oxygen within this range at the time of sintering so as to attain the above mentioned composition of the range $0<x<0.1$ and, after sintering for a specific time, lowering the temperature of the magnetite, a structure wherein layers of a high value of x in $Fe_3O_{4+x}$ are formed or $F_2O_3$ is finely dispersed and precipitated within and between the particles in $Fe_2O_4$ is obtained. In the range of $x>0.1$, the continuous phase of $Fe_2O_3$ precipitates out, which is an undesirable result.

(4) The resulting sintered magnetite exhibits remarkably high electrical resistance and transverse rupture strength.

Figure 1:
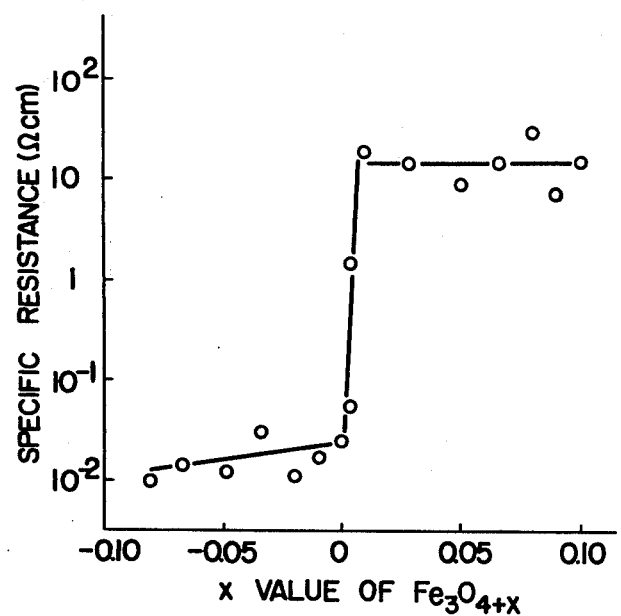
FIG. 1 is a graph indicating the variation of the specific resistance of sintered magnetite with variation of the x value in $Fe_3O_{4+x}$.

Referring now to FIG. 1, there is indicated therein the relationship between specific resistance and variation of the value of x in $Fe_3O_{4+x}$ of a sintered magnetite prepared by sintering a preformed magnetite powder structure similar to that of Example 1, described hereinafter, for 10 hours at 1,250° C. in an inert gas in which the partial pressure of oxygen was varied. This graph of FIG. 1 indicates that the specific resistance of the sintered magnetite increases abruptly in a range of x of $0<x<0.1$, that is, a range of $4.0/3<O/Fe<4.1/3$.

Figure 5:
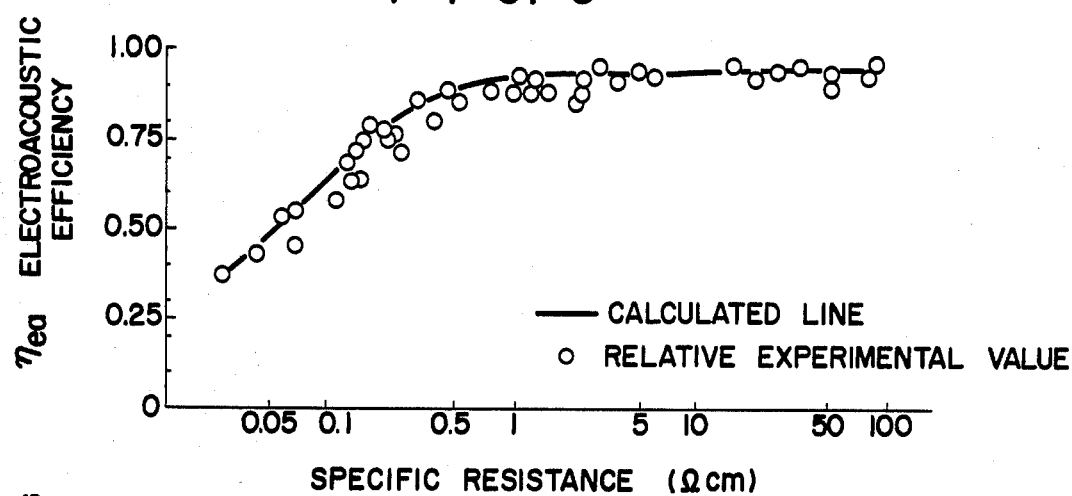
FIG. 5 is a graph showing relative experimental values and calculated values indicating the relationship between electroacoustic efficiency and specific resistance of a magnetite ferrite vibrator for a resonance frequency of 28 KHz.

In order to show how the electroacoustic efficiency $\eta ea$ (Pa/Pi wherein Pi is electric input power and Pa is actual acoustic power emitted from the transmitter) representing the efficiency of a magnetostrictive vibrator depends on the electrical resistance, the relationship between calculated $\eta ea$ values and relative experimental $\eta ea$ values is indicated in FIG. 5 where the theoretical calculation is based on Y. Kikuchi "Ultrasonic Transmitters," Corona Publishing Co., Tokyo, pp. 268-293 (1969).

Since the quantity which can be measured experimentally with respect to $\eta ea$ is a quality factor Q proportional thereto, the experimental Q value at a specific resistance of 100 ohm cm. which is close to the saturated value was assumed to be equal to the calculated $\eta ea$ value at said specific resistance and, at the other specific resistances, $\eta ea$ was calculated in proportion to the experimental Q value and the $\eta ea$ thus obtained was assumed as relative experimental-value. While the experimental-values shown in FIG. 5 were obtained with respect to $\pi$-shaped mangetite vibrator for 28 KHz prepared with varied compositions, it has been confirmed that substantially no variations are observed in the tendency with respect to vibrators for 15-100 KHz.

As illustrated in FIG. 5, when the specific resistance of a magnetostrictive vibrator is higher than 0.1 ohm cm., the electroacoustic efficiency thereof becomes more than 60%, and, when the specific resistance is higher than 0.5 ohm cm., the electroacoustic efficiency becomes more than 90%. The samples having a specific resistance of higher than 30 ohm cm. are increased in the specific resistance by the addition of titanium to magnetite.

It is desirable that a magnetostrictive vibrator has a higher electroacoustic efficiency, but a vibrator having the efficiency higher than 80%, i.e., the specific resistance more than 0.2 ohm cm., would be sufficient for practical use.

Next, the relationships of electromechanical coupling coefficient k which shows the dynamic performance of a ferrite structure with density and grain size will be set forth.

Figure 2:
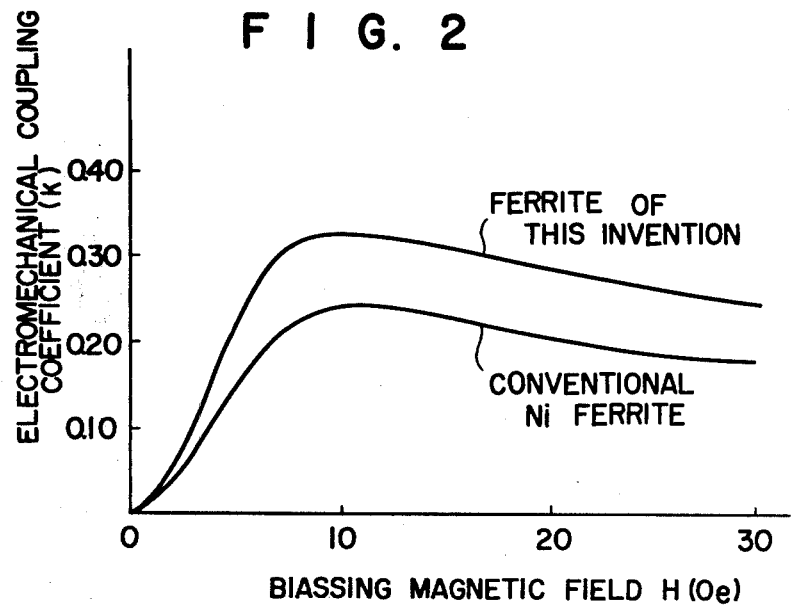
FIG. 2 is a graph showing curves indicating the relationships between electromechanical coupling coefficient and biassing magnetic field of a ferrite of this invention and of a conventional Ni-Cu-Co ferrite.

The relationship of electromechanical coupling coefficient (k) versus biassing magnetic field of a sintered magnetite produced in accordance with this invention is indicated in FIG. 2 in comparison with that of a conventional Ni-Cu-Co ferrite. These measured results indicate that the sintered magnetite of this invention exhibits a higher electromechanical coupling coefficient k than the conventional Ni-Cu-Co ferrite at all values of biassing magnetic field.

Figure 6A:
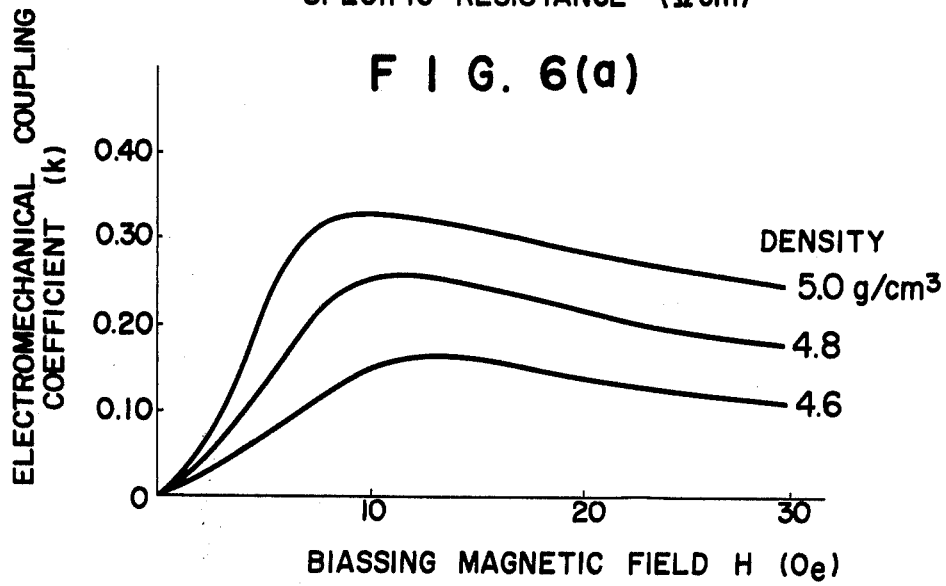
FIG. 6 is a graph indicating the variations of (a) the density and (b) the grain size of magnetite magnetostrictive vibrator in the relationship between electromechanical coupling coefficient and biassing magnetic field.
Figure 6B:
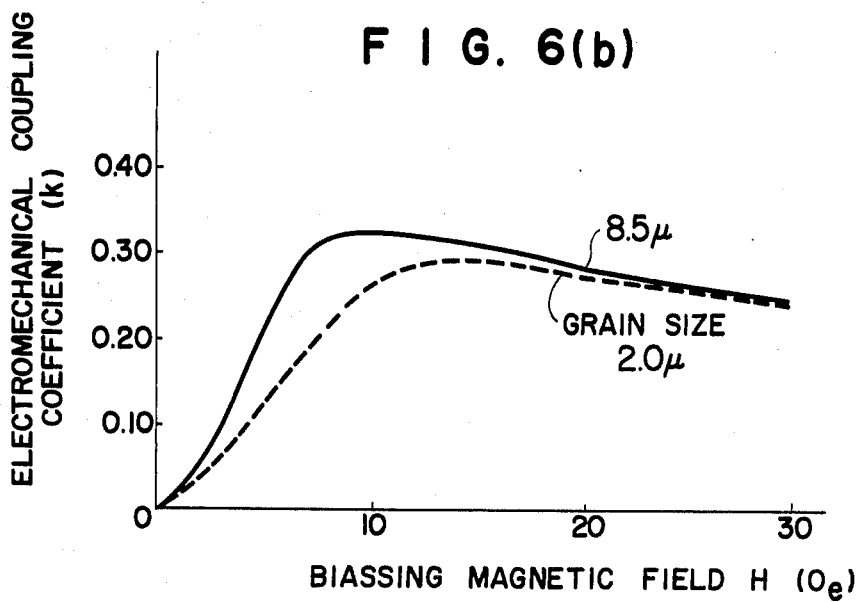

Further, the relationship of k versus density and that of k versus grain size are shown in FIGS. 6(a) and 6(b), respectively.

FIG. 6(a) indicates the k-values of three bar-shaped samples having different densities which have been obtained by shaping commercially available magnetite powder of three different particle sizes, i.e., $0.3\mu$, $1.2\mu$ and $3.3\mu$, and sintering the same at a temperature of 1,150° C., while FIG. 6(b) shows the k-values of two samples having different grain sizes obtained by sintering the same starting powder of commercially available magnetite having a particle size of $0.3\mu$ at 1,150° C. and 1,200° C., respectively.

As apparent from these Figures, a lower density results in a little higher optimum biassing magnetic field (optimum biassing magnetic field means a biassing magnetic field which gives the greatest k value) and a smaller absolute k value.

On the other hand, a smaller grain size results in a little smaller k and a higher optimum biassing magnetic field. This means that increased strength of a biassing magnet is required, which will be a disadvantage from a practical standpoint.

The samples shown in FIG. 6(b) can both be used, and thus it is desirable that a magnetostrictive vibrator has a higher density and a larger grain size in order to increase k in a relatively low biassing magnetic field.

However, this relationship does not necessarily applies from the standpoint of mechanical strength set forth hereinbelow.

As regards mechanical strength, properties required for a sintered structure are considerably complicated because any of the density, grain size and composition thereof and fine cracks thereon affects the mechanical strength. The sintering temperature and atmosphere as well as the rate of temperature rise and the particle size of starting powder are particularly important as the processing conditions.

FIG. 7 indicates a relationship between grain size and transverse rupture strength of magnetite obtained by sintering starting powder of various particle sizes at 1,150° C. In order to obtain transverse rupture strength of 900 Kg/cm$^2$ or higher, for example, in this Figure, it is essential that the average grain size should not exceed $50\mu$. Thus, a larger grain size is required from the standpoint of magnetostrictive property while a smaller grain size is desirable from the standpoint of mechanical strength if the density is identical. Further, a very short sintering time can produce a sintered structure having a smaller size but a lower transverse rupture strength due to low density. Accordingly, a grain size of $0.7\mu$ or smaller is not desirable from the standpoints of both mechanical strength and control of the sintering conditions. The lowest transverse rupture strength here may preferably be from 800 to 900 Kg/cm$^2$. The reason for this is that Ni-Cu-Co ferrite magnetostrictive vibrators sold at present on the market have a transverse rupture strength of 900 Kg/cm$^2$ or lower.

Thus, the particle size of starting powder is an essential factor other than the sintering temperature and atmosphere in obtaining a sintered magnetite structure having an average grain size not exceeding $50\mu$.

In addition, a sintered magnetite structure, being a ceramic material, has a low thermal shock resistance, and accordingly a rapid temperature decrease causes fine cracks therein which will materially lower the vibration strength.

As discussed hereinabove, the electric resistance, magnetostrictive property and mechanical strength required for a magnetostrictive vibrator largely depend on the density, grain size, composition and homogeneity of a sintered structure.

The inventors have found based on the aforementioned observation that sintered magnetite structures for magnetostrictive vibrators preferably meet the following requirements:

Density: at least 90%, preferably at least 95%, of the theoretical density (5.2 g/cm³) calculated based on the lattice constant of spinel structure measured by X-ray diffraction Grain Size: 0.7–50μ, preferably 1.0 to 20μ

Homogeneity: substantially free from macroscopic heterogeneity, i.e., pores or cracks Sintered magnetite structures which meet the above requirements can be obtained in accordance with the process of the present invention set forth hereinbelow.

Examples of iron oxides which can be used in the practice of this invention are magnetite, ferric oxide, and ferrous oxide. By maintaining any of these starting materials at a high temperature in an appropriate atmosphere for many hours, a sintered structure having a desired composition can be obtained. However, since it requires a long time for magnetite to reach the equilibrium of composition, the use of starting powder having a composition of $4.1/3 > O/Fe < 3.9/3$ can reduce the sintering time (See Example 12). The iron oxide is preferably in the form of powder of a particle size which is from 0.002 micron to 20 microns, preferably from 0.02 micron to 5 microns, when the molding characteristic and sintering time are considered. As starting powders, magnetite powder obtained by wet process is particularly preferred because it gives starting powder which is uniform in shape, highly homogeneous and can readily be sintered while providing a sintered structure with few pores and ensuring sintering at a relatively low temperature.

The powder obtained by the wet process herein means magnetite powder produced by a process of adding an alkali solution to an aqueous ferrous solution to form ferrous hydroxide and further oxidizing the ferrous hydroxide thus formed.

The heat for the sintering process is supplied by either electrical resistance heating or induction heating. While the sintering time varies, depending on the kind and particle size of the iron oxide, the sintering temperature, and the partial pressure of oxygen in the environmental atmosphere, it is ordinarily over 0.1 hour, preferably from 0.5 hour to 50 hours at a sintering temperature in the range of 1,000° to 1,400° C., preferably 1,000° to 1,350° C. When starting powder having a composition of $3.9/3 < O/Fe < 4.1/3$ is used, not exceeding 4 hours, preferably from 0.5 to 4 hours, are sufficient for sintering. The rate of temperature rise in the sintering process is ordinarily from 0.2° to 500° C./min. A high rate of temperature rise can be obtained by induction heating.

As regards the rate of temperature decrease, proper conditions are required in order to obtain crack-free sintered structures. FIG. 8 shows whether samples for various resonance frequencies are cracked or not when the temperature decreases at various rates. The samples used were prepared under the following conditions:

| Resonance Frequency (KHz) | Shape | Sintering Temperature (° C.) | Sintering Time (hr.) | Starting Powder | | |
|---|---|---|---|---|---|---|
| | | | | Preparation | Composition | Particle size (μ) |
| 15 | π | 1,250 | 3 | wet process powder | (O/Fe = 4.02, 0.5) | |
| 28 | NA | 1,250 | 3 | " | (O/Fe = 4.02, 0.5) | |
| 50 | π | 1,150 | 12 | " | (O/Fe = 4.02, 0.5) | |
| 100 | bar | 1,150 | 12 | " | (O/Fe = 4.02, 0.5) | |

Note:
In FIG. 8 . indicates samples free from cracks and x indicates those with cracks therein.

As shown in FIG. 8, such conditions that the cooling rate m (° C./min.) will meet the requirement m<0.5f where f (KHz) is a corresponding resonance frequency, regardless of the shape of the samples (whether bar-shaped, π-shaped, NA type or ring-shaped) are required.

Figure 3:
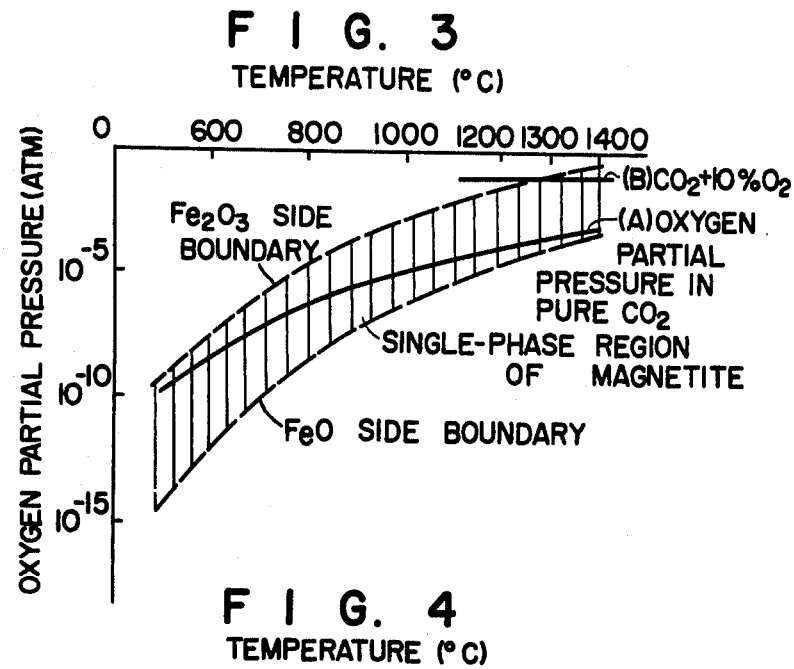
FIG. 3 is a graph showing related curves indicating a region wherein magnetite exists as functions of partial pressure of oxygen and temperature.

Atmosphere of the sintering process will now be considered with reference to FIG. 3. In FIG. 3, the hatched area indicates a region wherein a magnetite exists as functions of temperature and oxygen partial pressure. The $Fe_2O_3$ side boundary and the FeO side boundary defining this single-phase region of the magnitude are according to Darken, L. S. and Gurry, R. W., J. Am. Chem.Soc. 67, 1398–1412 (1945), and ibid. 68, 798–816 (1946). Lines (A) and (B) determining the oxygen partial pressure in the carbon dioxide atmosphere have been derived by calculation based on the dissociation equilibrium constant of carbon dioxide. With regard to the line (B), the effect of dissociated oxygen on the total oxygen partial pressure can be neglected.

As indicated in FIG. 3, when the oxygen partial pressure is excessively high, the precipitation of $Fe_2O_3$ becomes excessive, and, conversely, when the oxygen partial pressure is excessively low, FeO precipitates out. Accordingly, by resorting to a method of controlling the oxygen partial pressure during sintering of the preformed structure wherein the oxygen quantity is decreased at low temperatures and increased progressively at high temperatures, sintering can be accomplished without departure from the single-phase region of the magnetite. Control of the sintering atmosphere is essentially required for the production of a high-density homogeneous sintered structure.

When carbon dioxide gives off dissociated oxygen according to the temperature, the resulting partial pressure of the oxygen approaches the equilibrium oxygen pressure of the magnetite over a wide range of temperature. For this reason, by sintering a magnetite in a stream of carbon dioxide gas or carbon dioxide containing oxygen, the value of x in $Fe_3O_{4+x}$ can be easily controlled within the range of $0 < x < 0.1$. By carrying out the sintering for a certain time by determining the sintering atmosphere as described hereinbefore at the time of sintering so that the composition will be in the range of $0 < x < 0.1$, a sintered magnetite in which a layer of high value of x in $Fe_3O_{4+x}$ is precipitated within or between the particles, or $Fe_2O_3$ is finely dispersed and precipitated within or between $Fe_3O_4$ is obtained.

Referring again to FIG. 3, the curve A shown therein indicates the equilibrium oxygen partial pressure of pure carbon dioxide gas. As is apparent from this curve A, by starting the elevation of temperature in a stream of carbon dioxide gas at the time of sintering of a preformed structure, the sintering can be completed without departing from the single-phase region of the $Fe_3O_{4+x}$.

Furthermore, it is possible to control the value of x in $Fe_3O_{4+x}$ also by admixing a small quantity of oxygen gas with the carbon dioxide gas after the temperature has been raised, as indicated by curve B in FIG. 3. For example, as indicated by curve B, at a sintering temperature of 1,300° C., a desired sintered magnetite can be obtained even when the sintering is carried out in carbon dioxide gas containing 10 percent by weight or less of oxygen gas. In this case, according to the results of compositional analysis, the compositional region of x of the nonstoichiometric magnetite $Fe_3O_{4+x}$ existing at a high temperature was $0 < x < 0.1$.

In a magnetite sintering method in which carbon dioxide gas or carbon dioxide gas containing oxygen is used in this manner, complicated control of oxygen pressure is not required, and the method is superior on the point of simplifying the sintering process, being further advantageous particularly in the sintering of a preformed structure in which a caking agent or an oil lubricant is used.

The reason for this is that the carbon dioxide has a buffer effect on reductive gases such as CO gas resulting from the decomposition of substances such as the caking agent. That is, in the case where argon gas is used and caused to contain a very small quantity of oxygen, the oxygen partial pressure undergoes an abrupt and remarkable variation because of the generation of a very small quantity of CO gas from the above mentioned caking agent. In the case of a carbon dioxide gas atmosphere as in the present invention, however, the oxygen pressure is restricted by the equilibrium of $CO_2 \rightleftarrows CO + \frac{1}{2}O_2$, and, therefore, the effect of the CO gas, which is a decomposition gas, on the magnetite is not directly as pronounced as in the aforedescribed method.

This embodiment of the invention, that is, the sintering process in carbon dioxide gas is illustrated in Examples 4 and 5 set forth hereinafter. In accordance with this invention, as will be indicated more fully by these examples, a ferrite for magnetostrictive vibrators having excellent electrical characteristic and high mechanical strength can be produced by a simple operation wherein a magnetite is sintered in an atmosphere of carbon dioxide gas by itself or of carbon dioxide containing oxygen.

In accordance with another embodiment of this invention, sintering of the magnetite is carried out in water vapor, in which case the same result as that attainable by sintering the magnetite in carbon dioxide gas is obtainable. The single-phase existence region of a magnetite and the oxygen dissociation pressure equilibrium value of water vapor are indicated in the relationship between temperature and oxygen partial pressure in FIG. 4. As is apparent from this graphical representation, the oxygen dissociation pressure of water vapor assumes a value which is extremely close to that of the oxygen dissociation pressure of carbon dioxide gas.

This method of using water vapor has the advantage of entailing extremely low production cost in comparison with the aforedescribed methods. Specific procedures of practice of this method of sintering magnetite in a water vapor atmosphere are described in Examples 6 and 7 set forth hereinafter.

Figure 4:
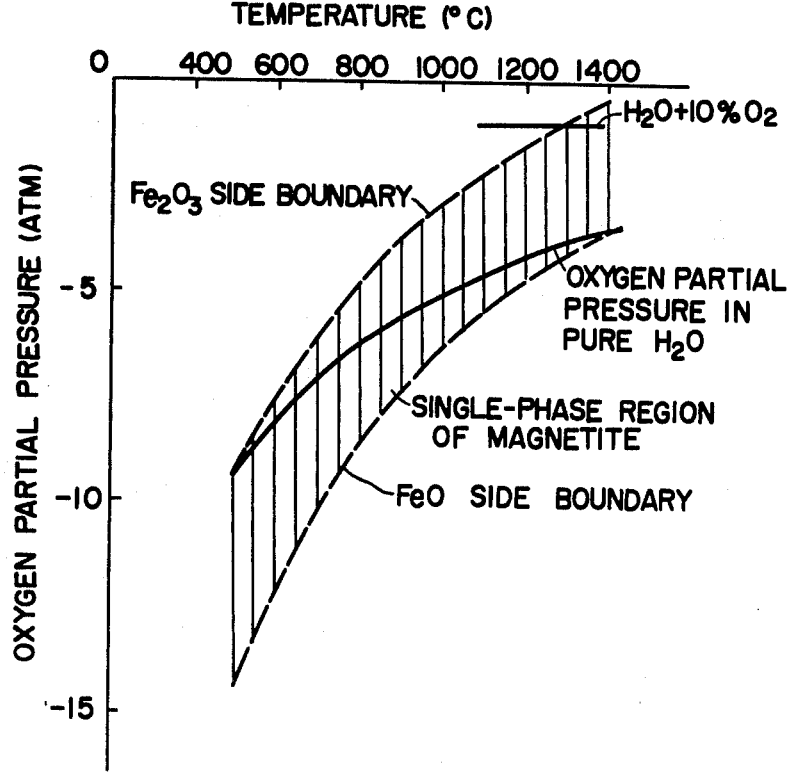
FIG. 4 is a graph showing related curves indicating a region wherein magnetite exists and oxygen dissociation pressure of water vapor in the relationship between partial pressure of oxygen and temperature.

A sintering method wherein a mixture of carbon dioxide gas and water vapor is used is also effective as indicated by the combination of FIGS. 3 and 4.

In ferrites for magnetostrictive vibrators, likewise soft ferrites, high density and homogeneity are required as the properties of sintered structures. Contrary to soft ferrites, however, ferrites for magnetostrictive vibrators are required to have a small grain size so as to increase the mechanical strength thereof, where a marked difference lies between these two types of ferrites. Thus, in order to produce a high-density sintered structure of a small grain size, it is necessary to find appropriate conditions such as the grain size of starting powder which is not too small but not too large and the sintering temperature which is not too low but not too high while, in soft ferrites, a high temperature is ordinarily sufficient to produce a high-density sintered structure of a large grain size.

Figure 9:
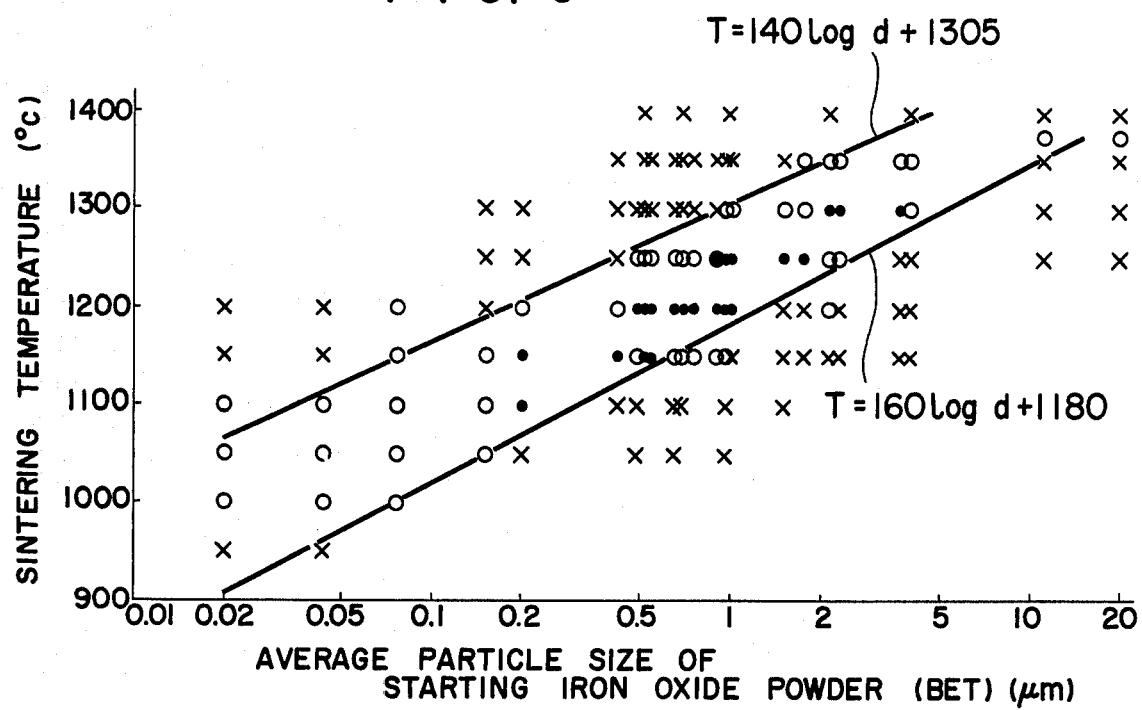
FIG. 9 is a graph showing the test results indicating whether $\pi$-shaped sintered structures obtained by sintering $\pi$-shaped structure formed from starting iron oxide powder of a given particle size at various temperatures are unsatisfactory (x), satisfactory ( ) or particularly superior ($\bullet$) as magnetostrictive vibrators in view of magnetism and mechanical strength.

FIG. 9 indicates whether $\pi$-shaped structures for 28 KHz (FIG. 10) obtained by sintering at various temperatures starting powders of various particle sizes prepared by various processes can be used for magnetostrictive vibrators or not. The actual processes of producing these samples are specifically described in Examples 8-11.

The tests were carried out as follows:

A vibrator for a resonance frequency of 28 KHz as shown in FIG. 10 was provided with a coil at a rate of 15 turn/leg to which a given supersonic input power was applied to cause the vibrator to undergo supersonic oscillation in water for a breakdown test.

Ordinarily, Ni-Cu-Co ferrite magnetostrictive vibrators are used with an input power of 2 $W/cm^2$. Therefore, the test started with causing the magnetite ferrite magnetostrictive vibrator of the present invention to undergo oscillation first with an input power of 2 $W/cm^2$ for 2 minutes, and thereafter repeating 2-minute oscillation with an input power of 2 $W/cm^2$ increased stepwise until the vibrator broke down.

Since the breakdown input power of commercially available Ni-Cu-Co ferrite used as a reference sample is $26 \pm 8$ $W/cm^2$, the test samples having a breakdown input power of at least 26 $W/cm^2$ were rated as satisfactory and marked with • in FIG. 9. Particularly superior vibrators having a breakdown input power of 40 $W/cm^2$ or higher were marked with ●.

In region A ($T > 140 \log d + 1,305$ where d is the particle size of the starting powder and T is the sintering temperature) the mechanical strength is lower due to a large grain size though the density is high. In region C ($T < 160 \log d + 1,180$) the mechanical strength is insufficient due to a low density or magnetostrictive property is reduced so that the samples falling within this region are inappropriate as vibrators. Region B between these two regions ($140 \log d + 1,305 \geq T \geq 160 \log d + 1,180$) provides the optimum sintering conditions for magnetite magnetostrictive vibrators. Such sintering conditions were found to be effective in production not only of vibrators for 28 KHz but also of all the vibrators for a resonance frequency in the range of from 15 to 100 KHz.

Next, in the preparation of the preformed powder structure, the iron oxide powder can be used singly as a starting material, but, for the purpose of improving the preforming characteristic, polyvinyl alcohol, glycerine, paraffin, or some other agent for imparting tackiness and zinc stearate, calcium stearate, or some other lubricant can also be used with the iron oxide. The total quantity of such an additive may be up to 5.0 percent by weight of the iron oxide without giving rise to problems.

In the case where such an additive is used, a high rate of temperature rise results in the rapid decomposition and evaporation of these organic compounds in the vicinity of 200°–700° C., whereby pores or even cracks are caused in sintered samples. Accordingly, it is essential that the rate of temperature rise should not exceed 10° C./min in the above mentioned temperature range. This requirement applies when the quantity of the aforesaid additives is in the range of from 0.2 to 5.0% by weight of the iron oxide. Experiments have verified that, when the quantity of the additives is below 0.2% by weight, special attention need not be paid to the rate of temperature rise and that, when it is above 5.0% by weight, pores remain in sintered structures whereby the strength of the resulting sintered structures is decreased.

The process for producing ferrites for magnetostrictive vibrators in accordance with this invention is applicable to production of vibrators, more precisely ferrite structure for vibrators, of any shape including bar (pillar or plate), $\pi$, NA or ring shape. Ferrite structures thus obtained are used by ordinary method, for example, as vibration generating elements (magnetostrictive elements) of ultrasonic washing machines and ultrasonic fabricating machines and tools.

Figure 11:
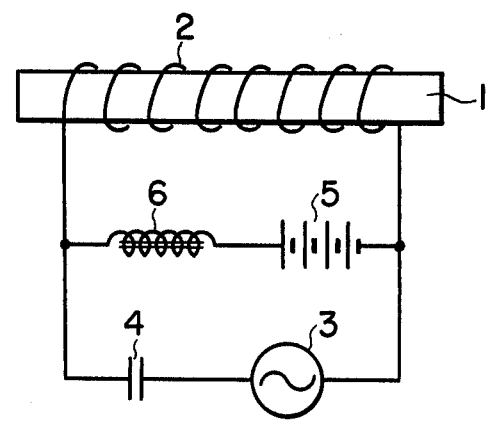
FIG. 11 shows a circuit in a magnetostrictive vibrating apparatus wherein the sintered ferrite obtained in accordance with the process of the present invention is used as a magnetostrictive vibrating element.

FIG. 11 shows a basic circuit construction of a magnetostrictive vibrator consisting of a magnetostrictive vibrator 1, a coil 2, a high frequency oscillator 3 of from 15 to 100 KHz, a condenser 4, DC biassing power source 5 and a choking coil 6.

While oscillation can be caused without any biassing magnet as in this case, it is preferable that a biassing magnet made of hard ferrite and the like be used since a DC biassing source and a choking coil can be omitted by the use of a biassing magnet so that the circuit can be simplified as well as the electric power required can be reduced.

Figure 12:
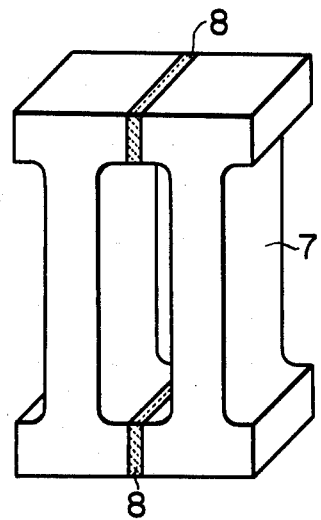
FIGS. 12-15 show combinations of magnetostrictive elements and biassing magnets of various forms, FIGS. 12-14 being perspective views, while FIGS. 15a and 15b being a plan view and an elevational view respectively showing the same combination.
Figure 13:
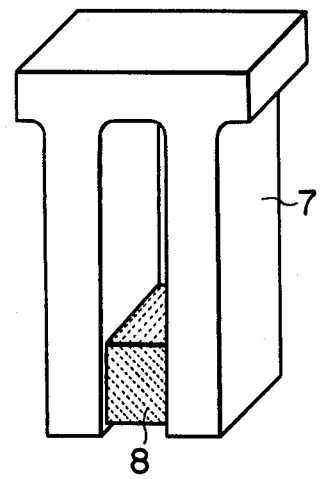
Figure 14:
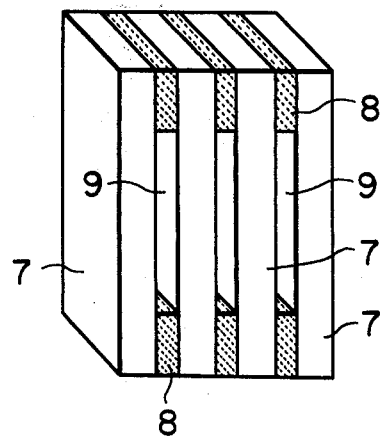
Figure 15A:
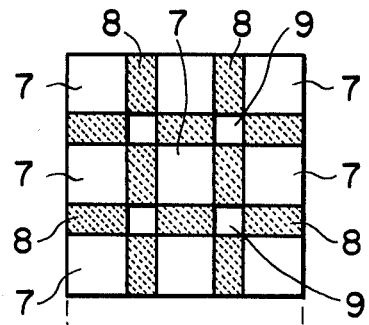
Figure 15B:
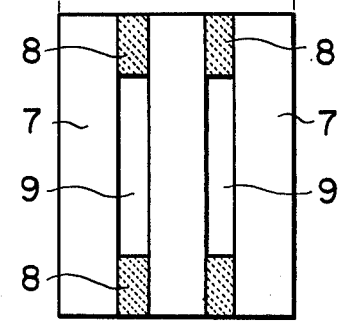

Vibrators of various forms in which biassing magnets are mounted are illustrated in FIGS. 12–15. FIG. 12 shows a vibrator of NA shape. FIG. 13 indicates that of $\pi$ shape, and FIGS. 14 and 15 illustrate other modifications of vibrators, FIGS. 12–14 being perspective views while FIGS. 15a and 15b being a plan view and an elevational view of the same combination of vibrator and magnet wherein the reference numeral 7 represents a magnetostrictive element of the ferrite structure of this invention, 8 indicates a biassing magnet and 9 designates a space.

Further, the sintered ferrite structures obtained in accordance with this invention have the characteristic feature of positive static magnetostriction and thus can be used in combination with a jig for compression, whereby the magnetostriction as well as durability of vibrators can be remarkably increased. This is specifically demonstrated by reference to FIGS. 16–21.

Figure 16:
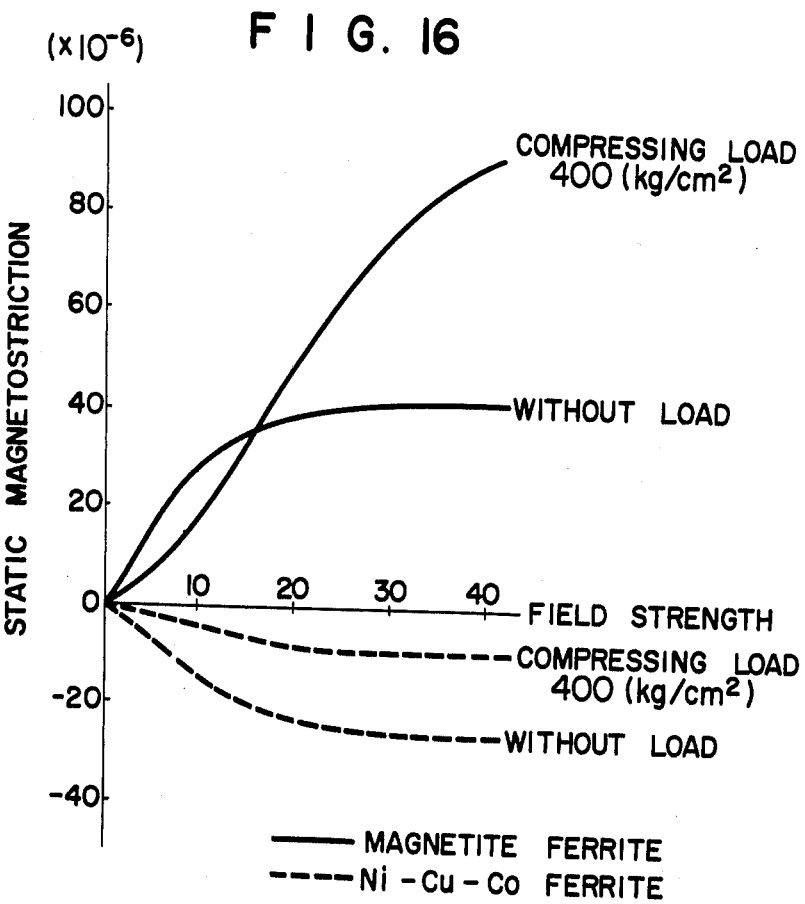
FIG. 16 shows static magnetostriction of magnetostrictive elements made of a magnetite ferrite of this invention and of a conventional Ni-Cu-Co ferrite without load and under compressing load, respectively.

The variation of static magnetostriction of the ferrite of this invention and that of the Ni-Cu-Co ferrite having negative static magnetostriction which is shown for the purpose of comparison are indicated in FIG. 16.

Figure 17:
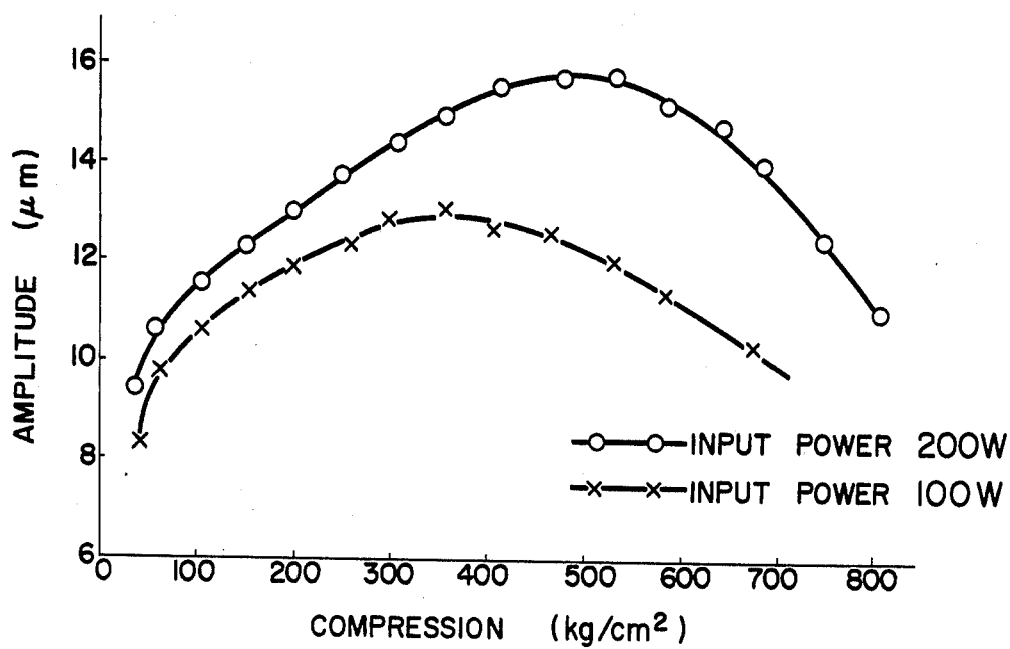
FIG. 17 shows the relationship between compressing load and amplitude with respect to given input powers.

FIG. 17 shows the relationship between compressing load and amplitude with respect to given input powers. Preferred compressing pressure is in the range of from 30 to 800 Kg/cm² per vibrating cross section. A compressing pressure lower than 30 Kg/cm² will result in generation of heat at a joint during vibration due to loose holding of the magnetostrictive element by the jig. Conversely, a compressing pressure higher than 800 Kg/cm² will decrease the oscillation efficiency due to excessive pressure applied to the magnetostrictive material. The optimum compressing load value becomes higher with the increase of input power.

Figure 18:
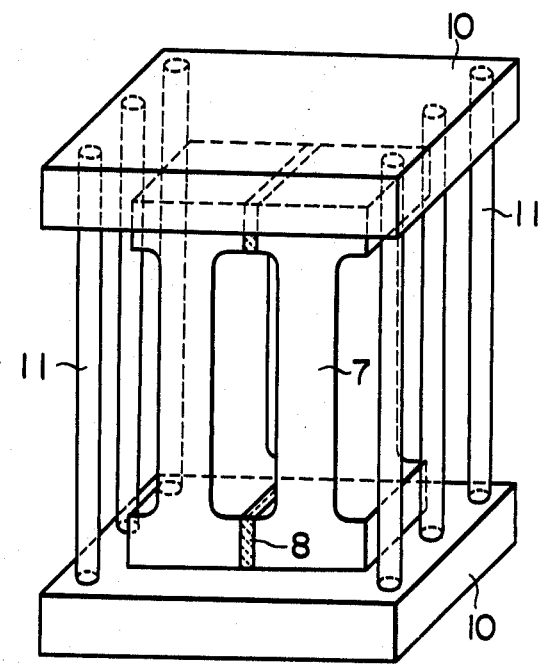
FIGS. 18–21 show combinations of magnetostrictive elements of various forms and jigs for compression, FIGS. 18 and 19 being perspective views while FIGS. 20 and 21 being elevational views.
Figure 19:
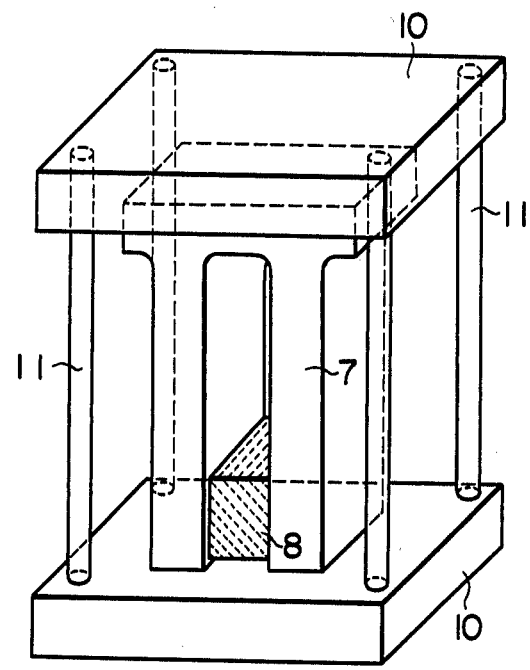
Figure 20:
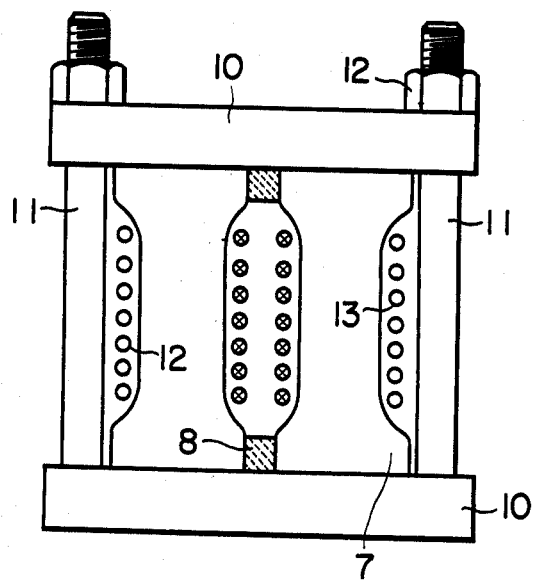
Figure 21:
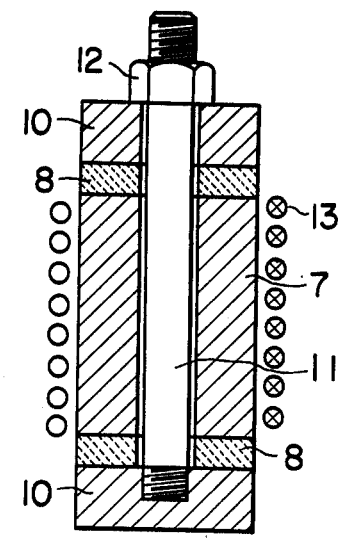

Some combinations of magnetostrictive elements of various forms and jigs are shown in FIGS. 18–21. FIGS. 18 and 19 are perspective views with reference to the vibrators of NA shape and $\pi$ shape, respectively, while FIGS. 20 and 21 are elevational views illustrating the vibrators of NA shape and ring shape, respectively, including choking coils, the reference numeral 7 designating a magnetostrictive element, 8 a biassing magnet, 10 a keep plate, 11 a bolt, 12 a nut and 13 a coil.

In order to indicate more fully the nature and utility of this invention, the following specific examples of practice constituting preferred embodiments of the invention are set forth, it being understood that these examples are presented as illustrative only and that they are not intended to limit the scope of the invention.

The measurements in the following examples were made in the following manner.

1. Electromechanical coupling coefficient was determined by calculation from the results of measurements with a vector impedance meter on test specimens of rod shape (requiring correction for demagnetizing field) or of ring shape.

2. Electrical resistance was measured by the conventional four-probe method.

3. Static magnetostriction quantity was measured by means of a strain gage.

4. The value of x of $Fe_3O_{4+x}$ was determined from the quantities of $Fe^{2+}$ and $Fe^{3+}$.

5. Compositional analysis—the $Fe^{2+}$ and $Fe^{3+}$ concentrations in each sample were determined, and the content was determined from $$O/Fe = \frac{[Fe^{2+}] + 3/2\,[Fe^{3+}]}{[Fe^{2+}] + [Fe^{3+}]}$$

6. Electroacoustic efficiency was obtained in the manner set forth hereinbefore.

7. All the particle sizes were measured according to BET method.

8. The grain size of each sintered structure was measured with an optical microscope.

EXAMPLE 1

A magnetite (particle size of 2$\mu$, x value of 0.03, and total quantity of metal impurities of 0.01 percent by weight) sold on the market was formed under a pressure of 1.5 ton/cm² into six preformed square bars each of 12×12×100-mm. size. These preformed bars were heated in a stream of purified argon in a furnace to a temperature of 1,350° C., and then the gas stream was changed to argon gas in which 10 percent by volume of oxygen gas had been mixed. The bars were left thus to sinter for 6 hours, after which the bars were left to cool in the furnace with maximum cooling speed of 25° C./min.

The sintered bars thus obtained were found to have an average density of 5.15 g./cm³, an average composition of $Fe_3O_{4.09}$, an average specific resistance of 10.8 ohm cm., an average value of electromechanical coupling coefficient k (under optimum bias magnetization) of 0.31, and an average transverse rupture strength of 1,250 kg/cm².

In addition, an input power of 50 W (34.7 W/cm²) was applied using a circuit shown in FIG. 11 to those sintered bars which were caused to undergo supersonic oscillation in water, whereupon vigorous bubbling occurred. After 24 hours of continuous oscillation, all six of these sintered bars were found to have unchanged electromechanical coupling coefficients.

EXAMPLE 2

Six preformed square bars prepared from magnetite powder having a particle size of $0.2\mu$ in the same manner as in Example 1 were heated in $N_2$ gas in a furnace to a temperature of 1,150° C. Then, into this $N_2$ gas, 1 percent by volume of oxygen gas was introduced, and the bars were thus sintered for 16 hours and then left to cool in the furnace with maximum cooling speed of 20° C./min.

The sintered bars thus obtained were found to have a density of 4.99 g/cm³., a composition of $Fe_3O_{4.06}$, a specific resistance of 18.6 ohm cm., an electromechanical coupling coefficient of 0.29, and a transverse rupture strength of 1,210 kg/cm², all of these quantities being average values.

EXAMPLE 3

Six preformed bars prepared from magnetite powder having a particle size of $0.05\mu$ in the manner specified in Example 1 were sintered for 16 hours at 1,050° C. in purified nitrogen gas in a furnace and were then left to cool in the furnace with maximum cooling speed of 15° C./min. During this process, the oxygen partial pressure in the nitrogen gas was approximately $10^{-8}$ atmosphere.

The sintered bars thus obtained were found to have (as average values) a density of 4.94 g/cm³, a composition of $Fe_3O_{4.01}$, a specific resistance of 2.6 ohm cm., an electromechanical coupling coefficient k of 0.28, and a transverse rupture strength of 1,150 kg/cm².

Next, sintering was carried out in carbon dioxide gas as a method by which the sintering process can be further simplified, as described in the following Examples 4 and 5.

EXAMPLE 4

0.5 percent by weight of polyvinyl alcohol was mixed with the magnetite powder specified in Example 3, and the resulting mixture was cold formed under a pressure of 1.5 ton/cm² into preformed specimens of bar shape each measuring 100×12×12 mm. These bar specimens were heated in a stream of pure carbon dioxide at a temperature rise rate of 5° C./min. to a temperature of 1,050° C., at which the specimens were sintered for 12 hours. The specimens were then left to cool in the furnace to room temperature with maximum cooling speed of 15° C./min.

The resulting sintered magnetite bars were found to have a density which was 95.5 percent of the theoretical density (5.20 g/cm³), a composition of $Fe_3O_{4.04}$, and a specific resistance of 31 ohm cm. Furthermore, the specimens exhibited a transverse rupture strength of 1,080 kg/cm² and an electromechanical coupling coefficient of 0.28. No variation was observable in the coupling coefficient after 24 hours of continuous oscillation with an electrical input of 40 watt/cm².

EXAMPLE 5

To a magnetite powder, 0.5 percent by weight of polyvinyl alcohol and 0.5 percent of weight of zinc stearate were added, and with the resulting mixture, bar-shaped preformed specimens were prepared under the same conditions as those specified in Example 1. The bar specimens were heated in a stream of pure carbon dioxide at a rate of 5° C./min. to 1,350° C. The carbon dioxide gas stream was then changed to a stream of a gas mixture of carbon dioxide gas and 10 percent by volume of oxygen, and at this temperature of 1,350° C., the specimens were sintered for 6 hours. Upon completion of the sintering, the gas mixture stream was again changed to a pure carbon dioxide stream, and the specimens were thus left to cool in the furnace to room temperature with maximum cooling speed of 25° C./min.

The sintered bars thus obtained had a density which was 97.8 percent of the theoretical density, a composition of $Fe_3O_{4.005}$, a specific resistance of 18 ohm cm., a transverse rupture strength of 1,220 kg/cm², and an electromechanical coupling coefficient of 0.31.

EXAMPLE 6

0.5 percent by weight of polyvinyl alcohol was mixed with a magnetite powder, and the resulting mixture was cold formed under a pressure of 1.5 ton/cm² into bar-shaped preformed specimens each measuring 100×12×12 mm. These specimens were heated in a stream of pure water vapor to 1,050° C. at a rate of 5° C./min., and at this temperature, the specimens were sintered for 12 hours and then left to cool in the furnace to room temperature with maximum cooling speed of 15° C./min.

The sintered magnetite bars thus obtained had a density which was 94.8 percent of the theoretical density, a composition of $Fe_3O_{4.03}$, a specific resistance of 16 ohm cm., a transverse rupture strength of 960 kg/cm², and an electromechanical coupling coefficient of 0.29. No change in this coupling coefficient was observable even after 24 hours of continuous oscillation with an electrical input of 25 watt/cm².

EXAMPLE 7

To a magnetite powder, 0.5 percent by weight of polyvinyl alcohol and 0.5 percent by weight of zinc stearate were added, and with the resulting mixture, the bar-shaped preformed specimens were formed under the same conditions as those specified in Example 1. These specimens were then heated in a stream of pure water vapor at a rate of 5° C./min. to 1,350° C. The water vapor stream was thereafter changed to a stream of a mixture of water vapor and 10 percent by volume of oxygen, and at this temperature of 1,350° C., the specimens were sintered for 6 hours. Upon completion of the sintering mixture gas stream was changed again to a stream of water vapor, and the specimens were left in the furnace to cool to room temperature with maximum cooling speed of 25° C./min.

The sintered bars thus obtained had a density which was 97.8 percent of the theoretical density, a composition of $Fe_3O_{4.002}$, a specific resistance of 22 ohm cm, a transverse rupture strength of 1,310 kg/cm², and an electromechanical coupling coefficient of 0.27.

Thus, in accorcance with this invention, ferrites for magnetostrictive vibrators of excellent electrical characteristics and high mechanical strength can be produced by a simple operation wherein a magnetite structure is sintered in an atmosphere of only water vapor or of water vapor containing oxygen.

EXAMPLE 8

0.2 percent by weight of polyvinyl alcohol was mixed with a magnetite powder (composition of $Fe_3O_{4\pm0.1}$ and particle size of from 0.15 to 0.97$\mu$) prepared by the wet process wherein an alkali was added to an aqueous ferrous solution to obtain ferrous hydroxide and the thus obtained ferrous hydroxide was further oxidized, and the resulting mixture was granulated and formed into $\pi$-shaped magnetostrictive vibrators for 15 KHz.

Powders having five different particle sizes as shown in the following table were prepared by controlling the pH of the solution, and shaped structures formed from these powders were heated from room temperature to the temperatures specified in Table 2 below at a rate of 2° C./min. The structures were maintained at the respective temperatures for 3 hours, and then left to cool to room temperature with maximum cooling speed of 6° C./min.

Sintering was carried out in carbon dioxide gas all through the process and for all the specimens.

The resulting sintered structures were found to have a composition of O/Fe in the range of from 4.01 to 4.09, and a specific resistance of from 0.5 to 20 ohm cm.

The ferrite vibrators thus obtained were provided with a coil therearound at a rate of 20 turn/leg and sunk into water together with the coil. High-frequency electric power was applied to the coil to cause the vibrators to undergo supersonic oscillation. The specimens marked with 0 in Table 2 below are those which could withstand a strong vibration caused by an input power of 26 $W/cm^2$ for 2 or more minutes. The specimens shown by the letters a–n are those which were damaged or had no sufficient vibrating ability. Among these specimens, a–e were poor in magnetostrictive property because of too small grain size of the sintered structures (all being smaller than 1.0$\mu$) and thus had no sufficient vibrating ability. Furthermore, b, c, d, f and g were broken down due to low density (4.6 $g/cm^3$ or lower), while h–n were broken down by vibration because of too large a grain size (larger than 20$\mu$) though the density thereof was sufficiently high.

Table 2

| Average Particle Size ($\mu$) | Sintering temperature (° C.) | | | | | |
|---|---|---|---|---|---|---|
| | 1,050 | 1,100 | 1,150 | 1,200 | 1,250 | 1,300 |
| 0.15 | o | o | o | h | i | k |
| 0.20 | a | o | o | o | j | l |
| 0.49 | b | e | o | o | o | m |
| 0.66 | c | f | o | o | o | n |
| 0.97 | d | g | o | o | o | o |

EXAMPLE 9

Ordinarily, the wet process as set forth in Example 8 can only be employed to produce a powder of a particle size not exceeding 1$\mu$. Thus, in order to prepare a powder of a larger particle size from the powder obtained by the wet process, preliminary roasting was carried out in carbon dioxide gas at 1,150° C. for 2 hours. The resulting powder was ground through a vibrating ball mill for 0.5, 1, 2, 8 and 20 hours, whereupon powders having an average particle size of 4.06, 2.15, 1.01, 0.70 and 0.51$\mu$, respectively, were obtained.

To the magnetite powder thus obtained, 0.5 percent by weight of calcium stearate was added, and the resulting mixture was formed under a pressure of 1 $ton/cm^2$ into $\pi$-shaped magnetostrictive vibrators for 100 KHz. These vibrators were heated at maximum temperature rise rate of 10° C./min. and maintained in an atmosphere wherein the partial pressure of oxygen is $10^{-4}$ atmosphere at the temperatures specified in Table 3 below for 10 hours, and then left to cool at a rate of 35° C./min.

The sintered structures thus obtained had a composition of O/Fe in the range of from 4.04 to 4.09, and a specific resistance of from 2 to 30 ohm cm.

These ferrite vibrators were provided with a coil therearound at a rate of 10 turn/leg and subjected to a vibration test under the same conditions as those specified in Example 8, the results of which are shown in Table 3.

The specimens b, c and d were broken down due to low density, while a and e had too small a grain size though the density thereof was sufficiently high. (On the contrary, f–p were broken down because of too large a grain size.

Table 2

| Average Particle size ($\mu$) | Sintering temperature (° C.) | | | | | |
|---|---|---|---|---|---|---|
| | 1,150 | 1,200 | 1,250 | 1,300 | 1,350 | 1,400 |
| 0.51 | o | o | o | f | h | k |
| 0.70 | o | o | o | g | i | l |
| 1.01 | a | o | o | o | j | m |
| 2.15 | b | o | o | o | o | n |
| 4.06 | c | c | e | o | o | p |

EXAMPLE 10

2.0 percent by weight of polyvinyl alcohol, 1.0 percent by weight of calcium stearate and 2.0 percent by weight of glycerol were added in solution to starting fine powders (3.91<O/Fe<4.25) of three different particle sizes obtained by the so-called thermal contact process wherein an aqueous ferrous solution was oxidized by thermal contact with an oil having a temperature as high as 250°–400° C. for a moment, and the resulting mixture was granulated and formed into $\pi$-shaped magnetostrictive vibrators for 50 KHz. These shaped structures were heated to the temperatures specified in Table 4 below at a rate of 1° C./min. in carbon dioxide gas. The structures were maintained at the respective temperatures for 12 hours, and then left to cool with maximum cooling speed of 25° C./min.

The resulting sintered structures had a composition of O/Fe in the range of from 4.001 to 4.023, and a specific resistance of from 0.2 to 4 ohm cm.

The ferrite vibrators thus obtained were subjected to the same test as in Example 9, the results of which are shown in Table 4 below wherein o indicates the specimens which could withstand an input power of 26 $W/cm^2$ while x indicates those which were broken down.

Table 4

| Average Particle Size ($\mu$) | Sintering temperature (° C.) | | | | | |
|---|---|---|---|---|---|---|
| | 950 | 1,000 | 1,050 | 1,100 | 1,150 | 1,200 |
| 0.020 | x | o | o | o | x | x |
| 0.043 | x | o | o | o | x | x |
| 0.076 | x | o | o | o | o | o |

EXAMPLE 11

A magnetite powder ($3.96 < O/Fe < 4.02$) produced by the so-called dry process, wherein $Fe_2O_3$ powder prepared by oxidation of ferrous sulfate at a high temperature was reduced with hydrogen at a temperature of from 300° to 450° C. and thereafter ground, was caused to pass through a vibrating ball mill for a period of from 1 to 24 hours, whereupon powders of five different particle sizes were obtained.

To these powders, 0.5 percent by weight of polyvinyl alcohol was added in solution, and the resulting mixture was granulated and formed into $\pi$-shaped magnetostrictive vibrators for 28 KHz.

The shaped structures thus obtained were heated at maximum rate of 6° C./min. to the temperatures specified in Table 5, at which temperatures the structures were maintained in argon gas, and then left to cool at a rate not exceeding 15° C./min.

The resulting sintered structures were found to have a composition of $4.01 \leq O/Fe \leq 4.06$, and a specific resistance of from 1.2 to 18 ohm cm.

As a result of the vibration resistance test conducted in the same manner as in the preceding Example, specimens which could withstand the test of 26 W/cm$^2$ for 2 minutes (shown by o) were as follows:

Table 5

| Average Particle Size ($\mu$) | Sintering Temperature (° C.) | | | | | | | |
|---|---|---|---|---|---|---|---|---|
| | 1,100 | 1,150 | 1,200 | 1,250 | 1,300 | 1,350 | 1,375 | 1,400 |
| 0.42 | x | o | o | x | x | x | | |
| 0.68 | x | o | o | o | x | x | | |
| 0.91 | x | o | o | o | x | x | | |
| 1.52 | x | x | x | o | o | x | | |
| 2.25 | x | x | x | o | o | o | x | x |
| 4.0 | x | x | x | x | o | o | o | x |
| 11.0 | | | | x | x | x | o | x |
| 20.0 | | | | x | x | x | o | x |

EXAMPLE 12

Six types of starting powders were formed into plate-shaped structures each of $20 \times 10 > 100$-mm. size, said starting powders having been prepared from the magnetite powder having a particle size of $0.91\mu$ and a composition of $O/Fe = 4.02$ in Example 11; the powders having an average O/Fe ratio of 3.90, 3.65 and 3.22, respectively, which had been obtained by adding FeO to the aforementioned magnetite powder; and the powders having an average O/Fe ratio of 4.09 and 4.28 which had been obtained by adding $Fe_2O_3$ to said magnetite powder.

These structures were heated in a water vapor stream from room temperature up to 1,200° C. at a rate of 10° C./min. Thereafter, 2 percent by weight of oxygen gas was introduced into the water vapor stream, and the structures were therein sintered for 0.5 hour, and then left to cool to room temperature at a rate of 10° C./min.

Analytical data of the O/Fe value of the sintered structures thus obtained were as shown in Table 6. The composition ranges were varied with increase of the sintering time, the results of which are summarized as follows:

Table 6

| Composition of Starting Powder (O/Fe) | 3.22 | 3.65 | 3.90 | 4.02 | 4.09 | 4.28 |
|---|---|---|---|---|---|---|
| Composition of Sintered Structure after | | | | | | |
| 0.5 hr. | 3.78 | 3.90 | 4.01 | 4.03 | 4.09 | 4.21 |
| 4 hr. | 3.84 | 3.95 | 4.02 | 4.03 | 4.08 | 4.12 |
| 10 hr. | 3.88 | 4.00 | | | | 4.09 |
| 24 hr. | 4.00 | 4.02 | | | | |
| 48 hr. | 4.02 | | | | | |

As apparent from the above data, when starting powder has a composition of $3.90/3 < O/Fe < 4.09/3$, the O/Fe ratio of the sintered structure obtained can be controlled to be within the range of from 4.0/3 to 4.1/3 by sintering for 0.5 to 4 hrs. It is advantageous from the standpoint of production on a commercial scale that sintering can be completed in such a short time.

We claim:

1. A supersonic magnetostrictive vibrator which comprises a magnetostrictive element of a macroscopically homogeneous sintered ferrite structure having an O/Fe atomic ratio of $4.0/3 < O/Fe < 4.1/3$, a resonance frequency f(KHz) of from 15 to 100 KHz, a density which is at least 90% of the theoretical density and an average grain size of from 0.7 to $50\mu$ and a positive static magnetostriction.

2. A supersonic magnetostrictive vibrator as claimed in claim 1 in which said magnetostrictive material is integrally provided on both sides thereof in the direction of vibration with a jig for compressing the magnetostrictive element having a structure such that the jig is capable of applying a compressing pressure of from 30 to 800 Kg/cm$^2$.

3. A microscopically homogenous sintered ferrite structure having an oxygen/iron atomic ratio of $4.0/3 < O/Fe < 4.1/3$; a resonance frequency of from 15 to 100 KHz; a density of at least 90% of the theoretical density and an average grain size of from 0.7 to $50\mu$.

4. The ferrite structure according to claim 3 which has a single phase structure of $Fe_3O_{4+x}$ where x is 0 to 0.1 having a structure wherein fine particles of $Fe_2O_3$ are dispersed in a $Fe_3O_4$ matrix.

5. A supersonic magnetostrictive vibrator as claimed in claim 1 in which sintered ferrite structure is a sintered magnetite ferrite structure.

6. A supersonic magnetostrictive vibrator as claimed in claim 3 in which said sintered ferrite is obtained from magnetite or a mixture of magnetite and ferric oxide.

* * * * *